(12) United States Patent
Wung et al.

(10) Patent No.: US 7,283,368 B2
(45) Date of Patent: Oct. 16, 2007

(54) HEAT DISSIPATING ASSEMBLY

(75) Inventors: Shih-Hsun Wung, Shenzhen (CN); Guang Yu, Shenzhen (CN); Da-Yuan Zhou, Shenzhen (CN); Chun-Chi Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 190 days.

(21) Appl. No.: 11/163,516

(22) Filed: Oct. 21, 2005

(65) Prior Publication Data

US 2007/0091576 A1   Apr. 26, 2007

(51) Int. Cl.
*H05K 7/20* (2006.01)
*F28F 7/00* (2006.01)
*H01L 23/34* (2006.01)

(52) U.S. Cl. .................. 361/719; 165/80.3; 165/185; 257/719

(58) Field of Classification Search ................ 257/718, 257/719; 361/719
See application file for complete search history.

(56) References Cited

U.S. PATENT DOCUMENTS

| | | | |
|---|---|---|---|
| 5,757,621 A | 5/1998 | Patel | |
| 6,480,387 B1 * | 11/2002 | Lee et al. | 361/704 |
| 6,497,273 B1 * | 12/2002 | Horng et al. | 165/80.3 |
| 6,545,879 B1 * | 4/2003 | Goodwin | 361/807 |
| 6,611,431 B1 * | 8/2003 | Lee et al. | 361/719 |
| 6,697,256 B1 * | 2/2004 | Horng et al. | 361/704 |
| 6,826,054 B2 * | 11/2004 | Liu | 361/719 |
| 7,126,823 B2 * | 10/2006 | Chen et al. | 361/702 |
| 7,142,422 B2 * | 11/2006 | Lee et al. | 361/695 |
| 7,164,583 B2 * | 1/2007 | Lee et al. | 361/704 |
| 7,180,743 B2 * | 2/2007 | Chen et al. | 361/704 |
| 2006/0245165 A1 * | 11/2006 | Lin | 361/704 |

* cited by examiner

Primary Examiner—Gregory D Thompson
(74) Attorney, Agent, or Firm—Winston Hsu

(57) ABSTRACT

A heat dissipating assembly includes a heat sink (10) having a chassis (12), a back plate (30) and a plurality of fasteners (40). Each fastener includes a screw cap (42), a spring (44) and a sleeve (46). The screw cap and the sleeve are movably connected together. The screw cap includes a head (420) and a tube (422) extending from the head. The tube includes a first cavity (424) and a second cavity (426). The back plate forms a plurality of posts (34) passing through the chassis and threadedly engaging in the first cavities of the tubes. A spring (44) is compressed between the first cavity of the tube and a bottom wall of the sleeve, for providing appropriate downwardly pressing force on the chassis of the heat sink against a CPU (22) mounted on a PCB (20).

20 Claims, 5 Drawing Sheets

HEAT DISSIPATING ASSEMBLY

DESCRIPTION

1. Field of the Invention

The present invention relates generally to a heat dissipating assembly for a computer, and more particularly to a heat dissipating assembly having fasteners for mounting a heat sink to a printed circuit board.

2. Description of Related Art

During operation of an electronic component such as a computer central processing unit (CPU), a large amount of heat is often produced. The heat must be quickly removed from the CPU to prevent it from becoming unstable or being damaged. Typically, a heat sink is attached to an outer surface of the CPU to absorb the heat from the CPU. The heat absorbed by the heat sink is then dissipated to ambient air.

Conventionally, a heat sink comprises a heat spreader and a plurality of fins extending from the heat spreader. The heat spreader is fastened on a printed circuit board by extending screws or bolts through holes defined in the printed circuit board.

Referring to FIG. 5, a conventional heat dissipating assembly 900 is shown, which comprises a heat sink 92 and fasteners 94.

The heat sink 92 comprises a heat spreader 920 and a plurality of fins 922 extending from the spreader 920. The spreader 920 has a bottom mating surface (not labeled) for thermally engaging with a heat generating electronic device such as a CPU (not shown) mounted on a printed circuit board (not shown). The heat spreader 920 forms four ears 924 extending outwardly from four corners thereof. Each ear 924 defines a hole 926, for permitting passage of the fastener 94 therethrough. An annular step portion 928 is formed by the ear 924 in the hole 926, for supporting a spring 96 thereon.

The fastener 94 comprises a circular head 940, an elongated shaft 942 extending from the head 940 and terminating with a threaded bottom end 944. The spring 96 is dimensioned to loosely fit around the shaft 942, and contacts the annular step portion 928 when installed, for exerting a spring force downwardly on the ear 924 when the fastener 94 is threadedly fastened to a retainer (not shown) attached to the printed circuit board. An annular recess 946 is defined in a middle of a circumferential periphery of the shaft 942. A washer 98 is received in the recess 946 to mount the fastener 94 to the ear 924 of the spreader 920 after the recess 946 of the shaft 942 and the threaded bottom end 944 passing through the hole 926 to reach a position below the ear 924.

In assembly, the spring 96 is fitted around the shaft 942. The shaft 942 is extended through the hole 106 of ear 924 of the spreader 920. The spring 96 is compressed between the head 940 and the annular step portion 928. The washer 98 snaps in the recess 946 of the shaft 942 when the recess 946 reaches the position below the ear 924.

However, the spring 96 directly contacts the spreader 920 such that the spring 96 is prone to scrape the spreader 920 during the compression of the spring 96 to a predetermined position in which the threaded bottom end 944 can have a threaded engagement with the retainer. The scraping between the spring 96 and the spreader 920 may form metal scraps, which if fall on the printed circuit board will affect the electrical characters of the electronic components on the printed circuit board and can increase electrical resistance of the components, or shorten the components, whereby the performance of the electronic components deteriorates, or even the electronic components break down.

In view of the above, a new heat dissipating assembly which overcomes the above-mentioned disadvantages is desired.

SUMMARY OF INVENTION

Accordingly, what is needed is a heat dissipating assembly having a fastener for fastening a heat sink to a printed circuit board, wherein during operation of the fastener, risk of scraping between a spring and the heat sink to form metal scraps which may cause short circuit of electronic components on the printed circuit board is prevented.

According to an embodiment of the present invention, a heat dissipating assembly comprises a heat sink having a chassis, a back plate and a plurality of fasteners. Each fastener comprises a screw cap, a spring and a sleeve. The screw cap comprises a head and a tube extending from the head. The tube comprises a first cavity and a second cavity. The back plate forms a plurality of posts passing through the chassis and threadedly engaging in the first cavities of the tubes, respectively. A spring is compressed between the screw cap and the sleeve, and exerts a downwardly pressing force on the sleeve against the chassis whereby the chassis is pushed by the springs to have an intimate contact with a CPU mounted on a printed circuit board through which the posts extend upwardly.

Other advantages and novel features of the present invention will become more apparent from the following detailed description when taken in conjunction with the accompanying drawings, in which:

DETAILED DESCRIPTION

Figure 1:
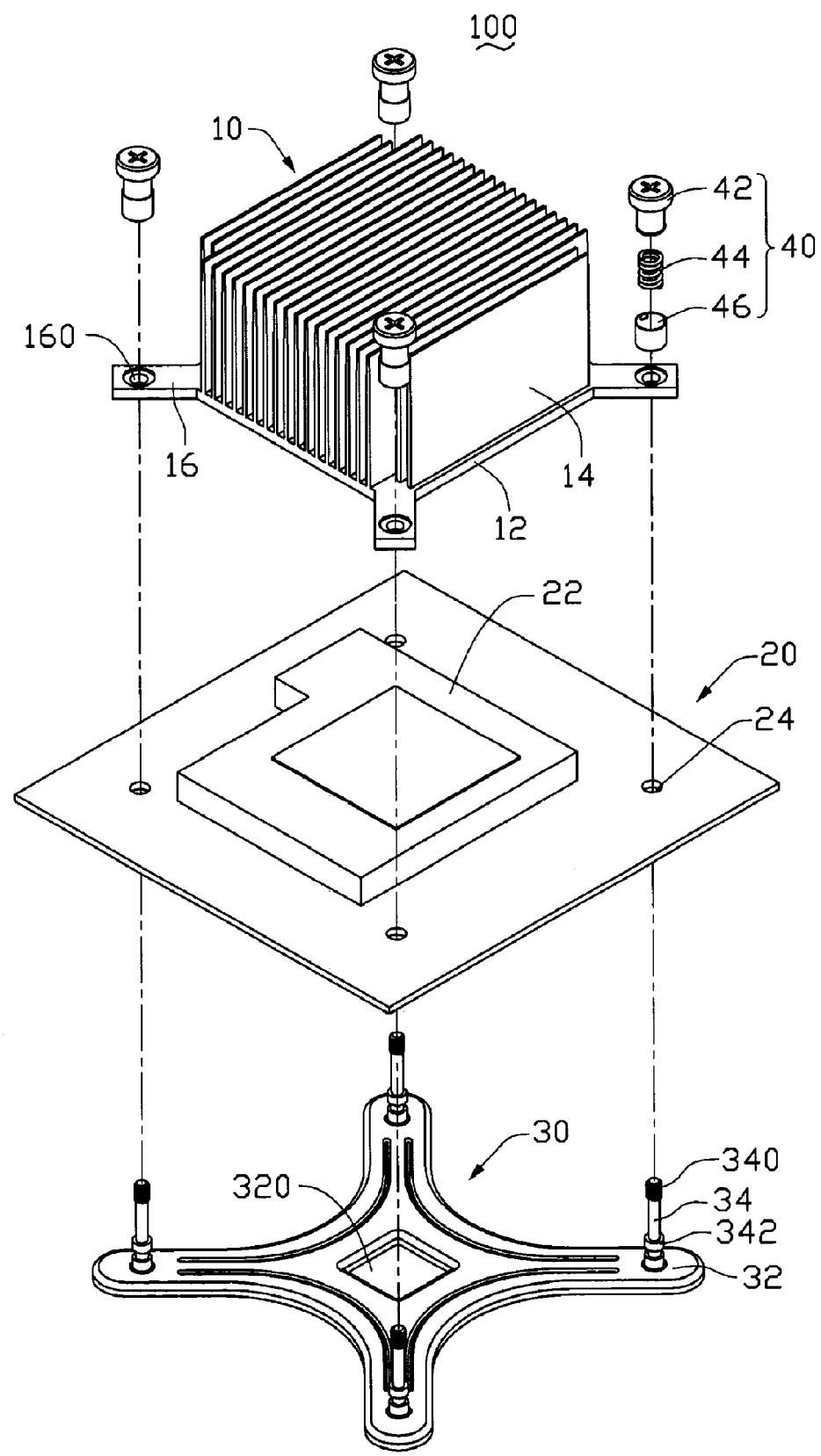
FIG. 1 is an exploded view of a heat dissipating assembly in accordance with one preferred embodiment of the present invention, and a printed circuit board mounted with a CPU thereon.

Reference will now be made to the drawing figures to describe a heat dissipating assembly 100 in accordance with a preferred embodiment of the present invention in detail.

Referring to FIG. 1, the heat dissipating assembly 100 comprises a heat sink 10, a backplate 30 and a plurality of fasteners 40. The heat dissipating assembly 100 removes heat from a CPU 22 mounted on a printed circuit board (PCB) 20. Four through holes 24 are defined in the PCB 20 respectively adjacent to four corners of the CPU 22.

The heat sink 10 comprises a chassis 12, and a plurality of fins 14 extending upwardly from the chassis 12. An ear 16 is extended horizontally and outwardly from each of four corners of the chassis 12. A fixing hole 160 is vertically defined through each ear 16. Each fixing hole 160 corresponds to one of the through holes 24 of the PCB 20.

The back plate 30 mounted on an underside of the PCB 20 comprises a cross-shaped base 32. An aperture 320 is defined in a central portion of the base 32. The aperture 320 is formed for reducing weight of the back plate 30. Four posts 34 extend upwardly from four respective distal ends of the base 32, for extending through the through holes 24 of the PCB 20 and through the fixing holes 160 of the heat sink 10. Each post 34 terminates with a threaded top end 340. A collar 342 is formed on a circumferential periphery of the post 34 and abuts against a bottom of the ear 16, for protecting the ear 16 of the heat sink 10 from being deformed downwardly by the fastener 40 with an excessive pressure and protecting the PCB 20 from being damaged.

Figure 2:
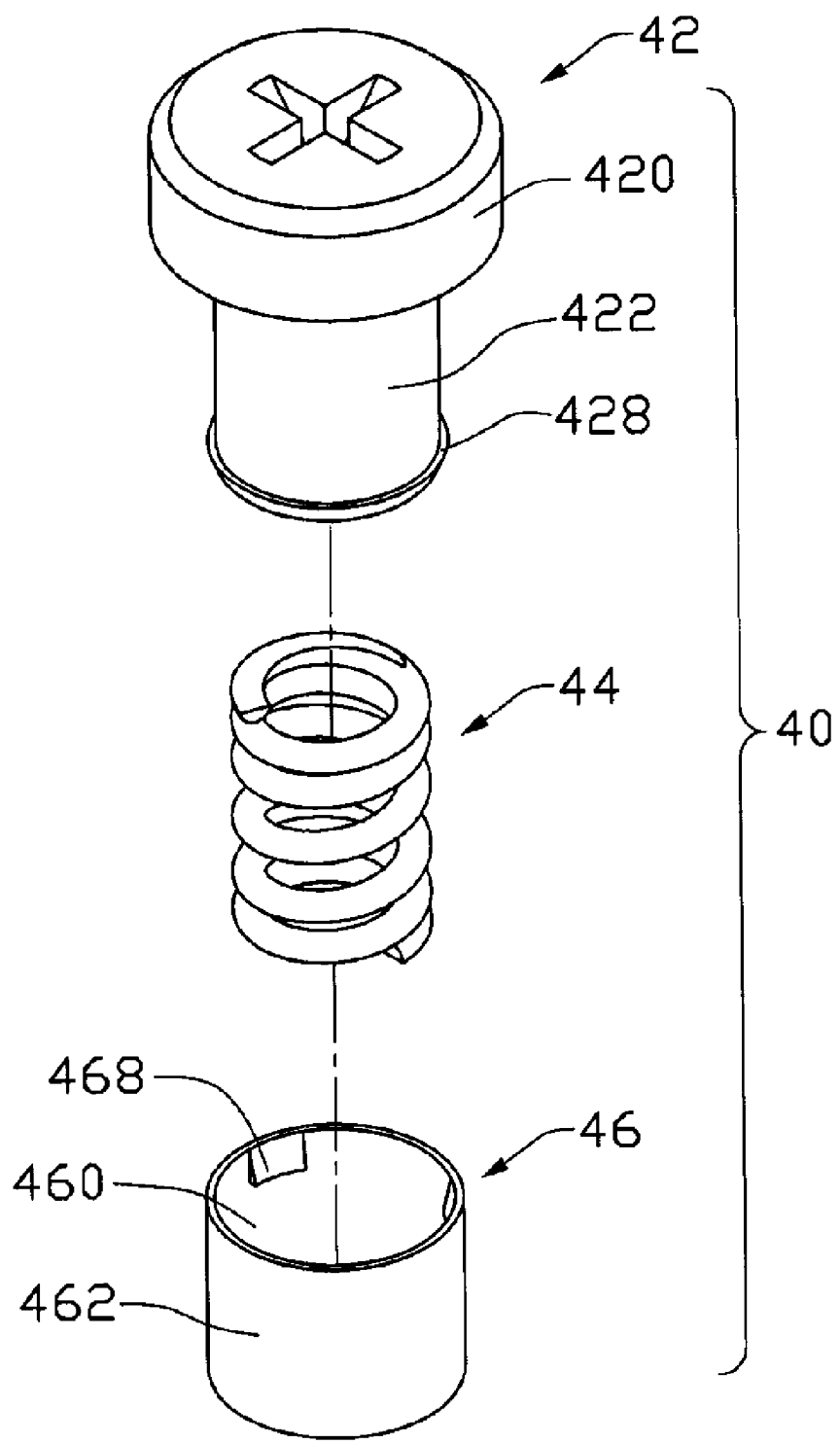
FIG. 2 is an enlarged exploded view of a fastener of the heat dissipating assembly of FIG. 1.
Figure 3:
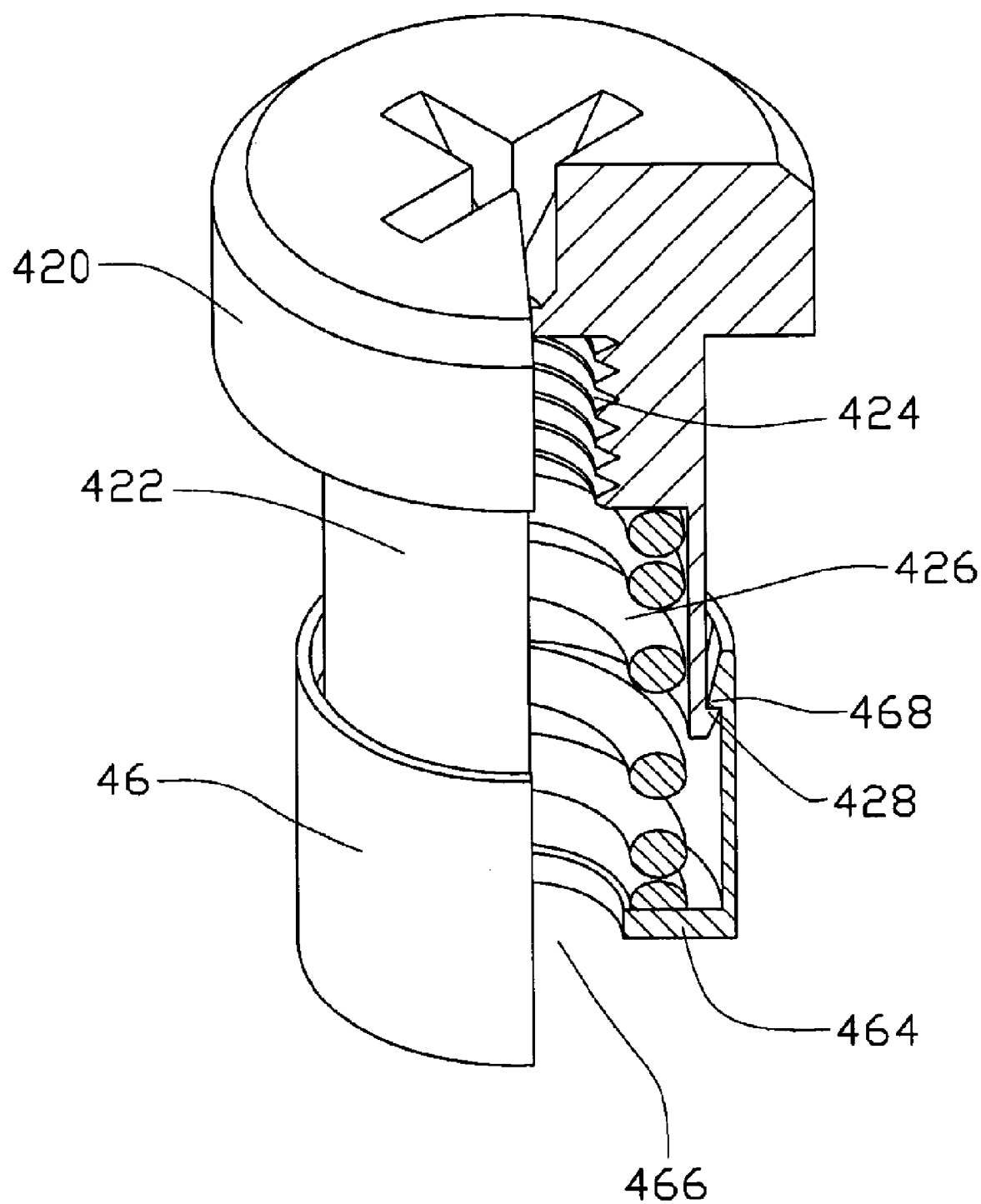
FIG. 3 is an assembled view of FIG. 2, wherein a part of the fastener is cut away to show an inner structure thereof.

Referring to FIG. 2 and FIG. 3, each fastener 40 is made of insulative material such as plastic, and comprises a screw cap 42, a spring 44 and a sleeve 46. The screw cap 42 comprises a circular head 420 having a cross slot (not labeled) therein so that a screwdriver (not shown) can be used to apply a rotation force to the screw cap 42. The screw cap 42 forms an elongated tube 422 extending downwardly from the head 420. The tube 422 comprises a first cavity 424 and a second cavity 426 communicating with the first cavity 424. The first cavity 424 is located above the second cavity 426. The second cavity 426 has a larger diameter than the first cavity 424, for receiving the spring 44 therein. The tube 422 has a thread (not labeled) in the cavity 424, for engaging with the threaded top end 340 of a corresponding post 34 of the back plate 30. A flange 428 is formed at a bottom end of a circumferential periphery of the tube 422. The flange 428 has a bevel (not labeled) for facilitating insertion of the tube 422 into the sleeve 46. The sleeve 46 defines a chamber 460 for receiving the spring 44. The first cavity 424, the second cavity 426 and the chamber 460 of the sleeve 46 cooperatively form a room for the fastener 40. The room receives the post 34 and the spring 44 therein. The sleeve 46 comprises a cylindrical wall 462 and a floor 464 extending inwardly from a bottom of the cylindrical wall 462. A plurality of spaced hooks 468 is circumferentially formed at an inner surface of the wall 462, for engaging with the flange 428 of the tube 42. The combination of the flange 428 of the tube 422 and the hooks 468 of the sleeve 46 acts as an interlocking means to provide a movable connection between the screw cap 42 and the sleeve 46. The floor 464 defines an opening 466, for permitting the passage of the post 34 into the fastener 40.

Figure 4:
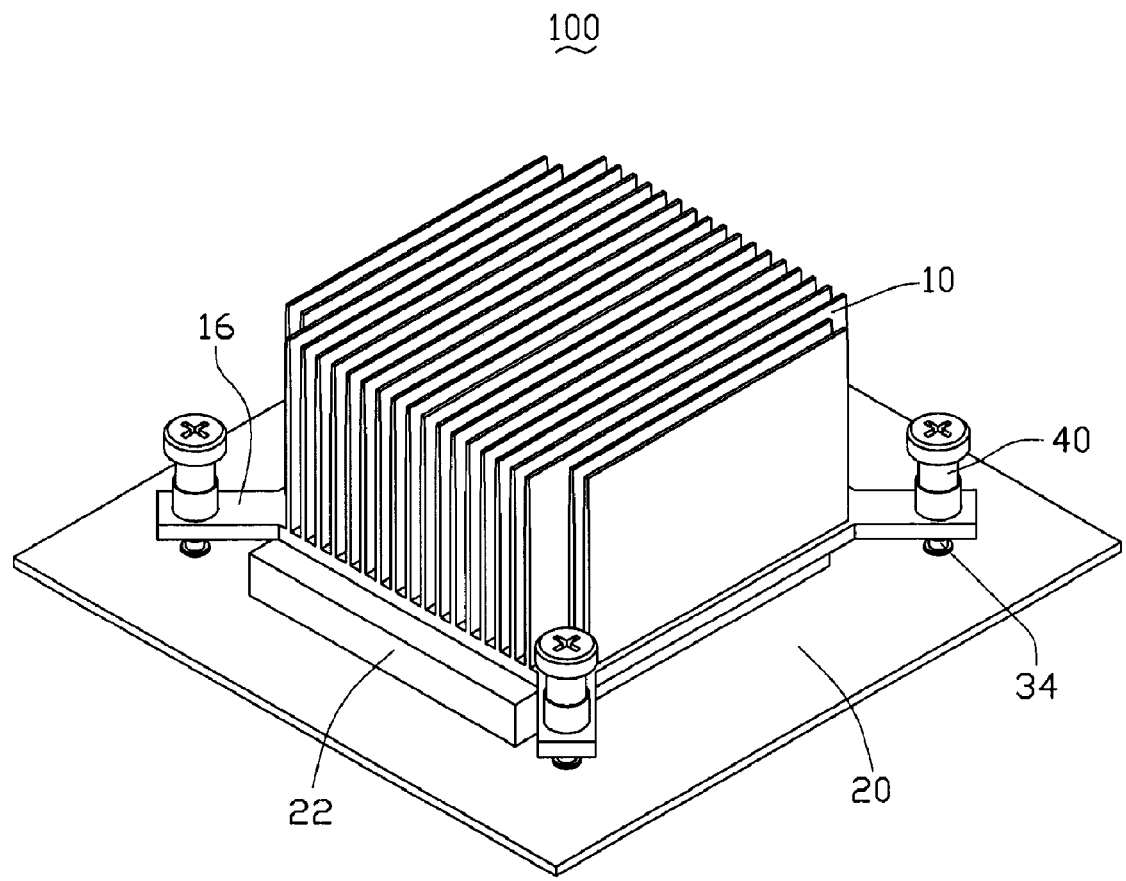
FIG. 4 is an assembled view of FIG. 1.
Figure 5:
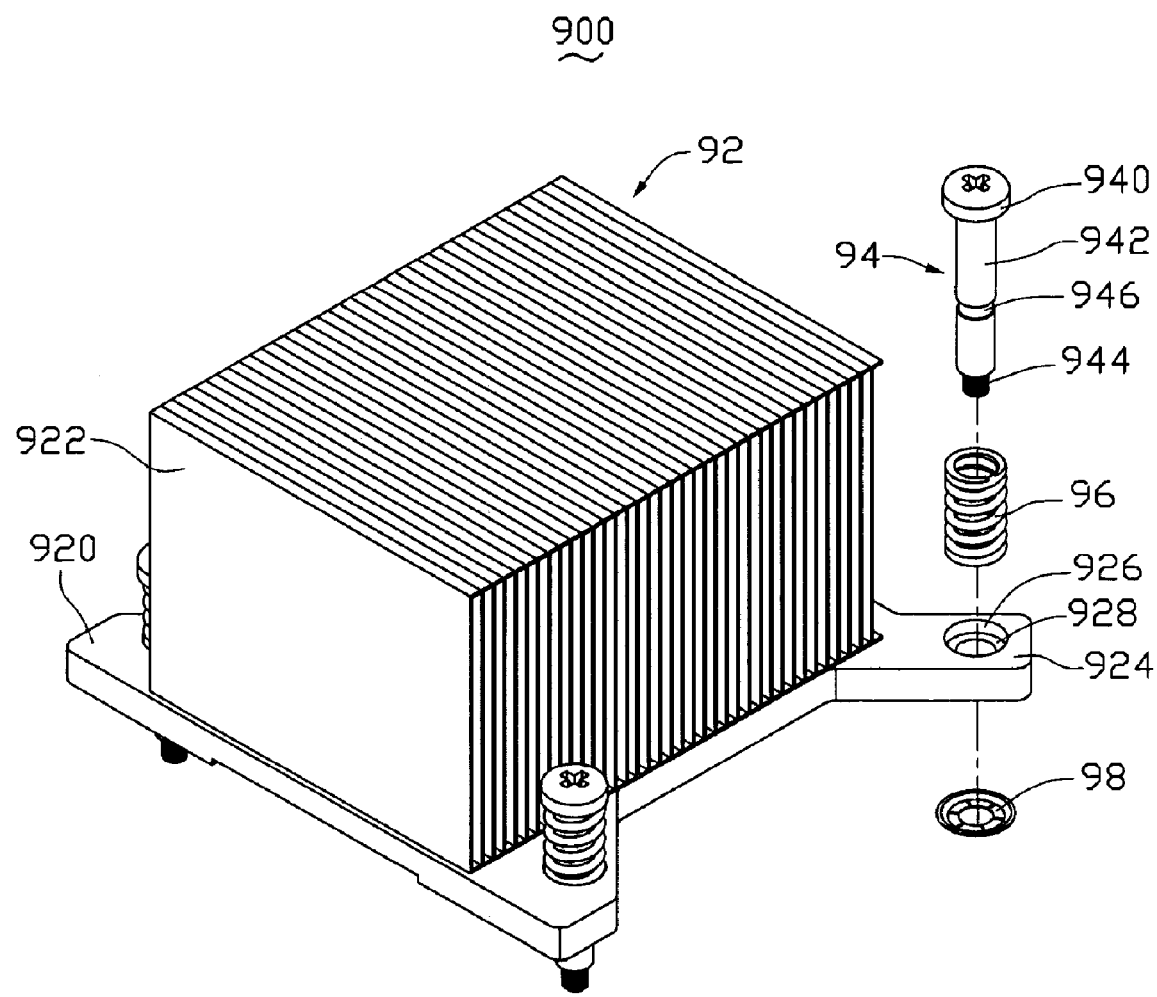
FIG. 5 is a partly assembled view of a conventional heat dissipating assembly.

Also referring to FIG. 4, in assembly of the heat dissipating assembly 100, the springs 44 are partly received in the chambers 460 of the sleeves 46, respectively. The sleeves 46 are then brought to be assembled with the tubes 422 of the screw caps 42 by to inserting the flanges 428 of the tubes 422 into tops of the sleeves 46 until the hooks 468 of the sleeves 46 lock with the flanges 428 of the tubes 422, whereby the screw caps 42 are movably connected with the sleeves 46. Simultaneously, the springs 44 are partly received in the second cavities 426 of the tubes 422. Accordingly, the springs 44 are totally received in the chambers 460 of the sleeves 46 and the second cavities 426 of the screw caps 42. A bottom end of the spring 44 abuts against the floor 464 of the sleeve 46 and a top end abutting a portion of the screw cap 42 around the thread in the first cavity 424. The springs 44 exert spring forces downwardly on the ears 16 via the bottom walls 464 of the sleeves 46 when the fasteners 40 are threadedly engaged with the posts 34 of the back plate 30 such that the risk of direct contact of the springs 44 and the ears 16 which may cause metal scraps to be formed between the springs 44 and the ears 16 is prevented. The fasteners 40 are thereby assembled.

The posts 34 of the back plate 30 are extended in turn through the through holes 24 of the PCB 20 and the fixing holes 160 of the ears 16. The heat sink 10 is placed on the CPU 22 mounted on the PCB 20. The fasteners 40 are assembled to the posts 34 of the back plate 30 by extending the threaded top ends 340 of the posts 34 through the openings 466 of the floors 464 and centers of the springs 96 to reach bottoms of the first cavities 424, respectively. Then the screwdriver is used to rotate the screw caps 42 until the threaded top ends 340 are tightly threadedly engaged with the threads in the first cavities 424 of the screw caps 42. The floors 464 of the sleeves 46 are pushed by the springs 44 to depress the ears 16 of the chassis 12 of the heat sink 10. Thus, the chassis 12 of the heat sink 10 can have an intimate contact with the CPU 22 to thereby absorb heat from the CPU 22. The threaded engagement of the threaded top ends 340 of the posts 34 with the threads in the first cavities 424 of the tube 422 provides a firm connection of the heat sink 10 to the PCB 20. The heat sink 10 is thereby secured to the PCB 20. In this position, the chassis 12 of the heat sink 10 is attached on the CPU 22. The springs 44 are compressed between the first cavities 424 of the tubes 422 and the floors 464 of the sleeves 46, whereby the springs 44 provide appropriate pressing forces on the ears 16 of the heat sink 10 toward the CPU 22. Thus, the heat sink 10 is intimately and evenly contacted with the CPU 22.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipating assembly comprising:
   a printed circuit board supporting a CPU thereon;
   a heat sink mounted on the CPU, comprising a chassis and a plurality of fins extending from the chassis;
   a fastener having a room, a floor resting on the chassis of the heat sink, and a spring received in the room and contacting the floor; and
   a back plate having a post extending through the printed circuit board, the chassis of the heat sink and the floor of the fastener into the room of the fastener and threadedly engaged in the room of the fastener.

2. The heat dissipating assembly of claim 1, wherein the fastener is made of insulative material, and comprises a cap, and a sleeve movably connected with the cap, the sleeve having a chamber, the spring is received in the cap and the chamber of the sleeve.

3. The heat dissipating assembly of claim 2, wherein the floor is formed on the sleeve and defines an opening providing a passage of the post of the back plate into the fastener.

4. The heat dissipating assembly of claim 2, wherein the cap comprises a first cavity and a second cavity communicating with the first cavity, the second cavity has a larger diameter than the first cavity, the cap defining a thread in the first cavity and the second cavity receiving the spring therein.

5. The heat dissipating assembly of claim 4, wherein the first cavity, the second cavity of the cap and the chamber of the sleeve form the room of the fastener, cooperatively receiving the spring therein.

6. The heat dissipating assembly of claim 4, wherein the post extending into the first cavity comprises a threaded top end, the threaded top end threadedly engaging with the thread in the first cavity of the cap.

7. The heat dissipating assembly of claim 2, wherein an interlocking means is formed between the cap and the sleeve for providing a movable connection between the cap and the sleeve.

8. The heat dissipating assembly of claim 7, wherein the interlocking means comprises a flange formed at an end of a circumferential periphery of the cap, and a plurality of hooks formed at inner surface of the sleeve and engaged with the flange.

9. A heat dissipating assembly comprising:
a printed circuit board;
a heat sink mounted on the printed circuit board;
a fastener comprising a cap having a cavity, a sleeve engaged with the cap, and a spring, the sleeve having a chamber and a floor resting on the heat sink, the cavity and the chamber cooperatively receiving the spring therein, the spring contacting the floor; and
a back plate having a post extending through the printed circuit board, the heat sink and the floor of the sleeve into the cavity of the cap, the post threadly engaged in the cavity.

10. The heat dissipating assembly of claim 9, wherein the cavity comprises a first cavity and a second cavity having a larger diameter than the first cavity, the spring is received in the second cavity and the chamber.

11. The heat dissipating assembly of claim 10, wherein the post terminates with a threaded top end which passes through the heat sink and the floor of the sleeve into the first cavity to be threadly engaged in the first cavity.

12. The heat dissipating assembly of claim 9, wherein an interlocking means is formed between the cap and the sleeve for providing a movable connection between the cap and the sleeve.

13. The heat dissipating assembly of claim 12, wherein the interlocking means comprises a flange formed at an end of a circumferential periphery of the cap, and a plurality of hooks formed at inner surface of the sleeve and engaged with the flange.

14. The heat dissipating assembly of claim 9, wherein a collar is formed on a circumferential periphery of the post and abuts against a bottom of the heat sink.

15. An electronic assembly comprising:
a printed circuit board having a bottom surface and a top surface;
a heat-generating electronic component mounted on the top surface of the printed circuit board;
a back plate mounted on the bottom surface of the printed circuit board, comprising a plurality of posts extending upwardly through the printed circuit board around the heat-generating electronic component;
a heat sink having a base in contact with the heat-generating electronic component, the posts extending through the base of the heat sink; and
a plurality of fasteners fastened to top ends of the posts, respectively, each fastener having a bottom wall and a spring pushing downwardly the bottom wall against the base of the heat sink.

16. The electronic assembly of claim 15, wherein each of the posts has a threaded top end threadedly engaging in a corresponding fastener.

17. The electronic assembly of claim 16, wherein each of the fasteners comprises a screw cap and a sleeve movably connected to a bottom of the screw cap, the threaded top end of each of the posts threadedly engaging in a cavity defined by the screw cap of the corresponding fastener.

18. The electronic assembly of claim 17, wherein the spring is received in a space commonly defined by the sleeve and the screw cap.

19. The electronic assembly of claim 18, wherein the bottom of the screw cap has a flange on an outer periphery thereof, the sleeve has hooks on an inner periphery thereof, the flange being inserted into the sleeve and engaging with the hooks.

20. The electronic assembly of claim 19, wherein the screw cap has a slot in a top thereof, adapted for fitting with a screw driver.

* * * * *